(12) United States Patent
Armstrong

(10) Patent No.: US 7,777,508 B2
(45) Date of Patent: Aug. 17, 2010

(54) ELECTRICAL TEST LEAD WITH A REPLACEABLE INLINE FUSE

(76) Inventor: Eric A. Armstrong, 8116 Castle Lake Rd., Indianapolis, IN (US) 46256

( * ) Notice: Subject to any disclaimer, the term of this patent is extended or adjusted under 35 U.S.C. 154(b) by 118 days.

(21) Appl. No.: 12/006,838

(22) Filed: Jan. 7, 2008

(65) Prior Publication Data

US 2009/0174394 A1    Jul. 9, 2009

(51) Int. Cl.
  *G01R 31/02* (2006.01)
(52) U.S. Cl. .................................................... 324/754
(58) Field of Classification Search ................ None
  See application file for complete search history.

(56) References Cited

U.S. PATENT DOCUMENTS

| | | | | |
|---|---|---|---|---|
| 3,820,017 A | * | 6/1974 | Reichenbach | 324/72.5 |
| 4,281,888 A | * | 8/1981 | Seaman | 439/692 |
| 4,464,623 A | * | 8/1984 | Chambon | 324/72.5 |
| 6,356,853 B1 | * | 3/2002 | Sullivan | 324/537 |
| 7,135,851 B1 | * | 11/2006 | Armstrong et al. | 324/142 |
| 7,238,058 B1 | * | 7/2007 | French | 439/668 |
| 7,242,173 B2 | * | 7/2007 | Cavoretto | 324/72.5 |
| 7,468,602 B2 | * | 12/2008 | Sleeman et al. | 324/99 D |
| 2006/0043959 A1 | * | 3/2006 | Cavoretto | 324/72.5 |
| 2007/0069716 A1 | * | 3/2007 | Sleeman et al. | 324/99 D |
| 2009/0206823 A1 | * | 8/2009 | Armstrong | 324/114 |
| 2010/0090682 A1 | * | 4/2010 | Armstrong | 324/114 |

FOREIGN PATENT DOCUMENTS

| | | | |
|---|---|---|---|
| FR | 2408146 A | * | 7/1979 |
| GB | 2387488 A | * | 10/2003 |

* cited by examiner

*Primary Examiner*—Jermele M Hollington
(74) *Attorney, Agent, or Firm*—Bruce J. Bowman

(57) ABSTRACT

An electrical test lead for use with a multi-meter has a fuse assembly adapted to releasably hold a fuse in-line of the electrical wire connecting ends of the electrical test lead. The fuse assembly may be permanently attached to the electrical test leads or may be releasably attached at one or both ends thereof to electrical test lead sections. The fuse assembly includes a fuse holder that is preferably clear to see the replaceable fuse therein in order to determine whether the fuse has blown. The electrical test lead has a fuse assembly holding a replaceable fuse electrically connected to and situated between a first test lead section terminating in a test lead plug that is adapted to be received in a test lead receptacle of a multi-meter and a second test lead section terminating in one of an electrical test probe and a test lead receptor adapted to receive a test lead tool.

12 Claims, 3 Drawing Sheets

ELECTRICAL TEST LEAD WITH A REPLACEABLE INLINE FUSE

BACKGROUND OF THE INVENTION

1. Field of the Invention

The present invention relates to equipment for taking electrical measurements of electrical circuits, components and/or devices and, more particularly, to electrical test leads for use with electrical test equipment for taking electrical measurements of electrical circuits, components and/or devices, such as digital multi-meters.

2. Background Information

Digital multi-meters (DMMs) and other types of electrical testing equipment are used to take various electrical measurements of electrical circuits, devices and/or components. Such electrical testing equipment may include one or more test leads that may be used in conjunction with the electrical testing equipment or not. The test leads may be used for various types of electrical measurement/testing. For instance, test engineers and/or technicians use DMMs for measuring voltages and currents in electrical circuits, control panels and/or electrical elements and/or components. Electrical test leads are used in conjunction with DMMs in order to manually connect the electrical subject (i.e. the electrical circuit, control panel, electrical element or component) with the DMM in order to obtain the electrical measurement. Such electrical test leads comprise wires having a plug on one end for receipt by the DMM and a probe, clip or connector on the other end for contact with the electrical test subject.

DMMs are internally fused in order to protect their internal circuitry from harm during test measurement. Typically, DMMs are internally fused at ten amps (10 A) for circuit current measuring. Measuring circuit current requires the test leads to be inserted into different test lead reception terminals of the DMM versus those used for measuring voltage. Occasionally, however, engineers/technicians forget to switch the test leads from the current measuring test lead reception terminals of the DMM to the voltage measuring test lead reception terminals of the DMM. If the test leads are in the current measuring test lead reception terminals of the DMM and the test leads are used to take a voltage reading (measurement), a short circuit condition will occur, causing fuses to blow. Since electrical component(s) are commonly protected via fuse or circuit breaker at amperages less than the DMM, the electrical component will lose power by blowing its fuse or tripping its circuit breaker, thus causing the electrical component(s) or electrical system to fail.

Also, even if the electrical components are fused greater than the DMM, a short circuit condition will cause the internal fuse of the DMM to blow thus requiring the DMM fuse to be replaced. While replacing the fuse on a DMM is not a difficult task, it is time-consuming. Moreover, DMM fuses are an atypical type of fuse which is expensive compared to ordinary glass/ceramic fuses as used in typical industrial electrical applications and the like. As such, DMM fuses are not likely to be stored on the shelf in a company's spare parts depot.

Another manner in which electrical test leads are typically used by engineers and/or technicians is as jumpers between positive voltage terminals and other terminals in order to test an electrical control system's inputs and outputs during startup or when checking out a control panel. However, accidental touching of a neutral or control panel ground will cause a short circuit with the negative results as indicated above.

It is therefore evident from the above that there is a need for a manner of protecting electrical components when using test leads for various typical and atypical uses and/or applications.

SUMMARY OF THE INVENTION

In view of the above, the present invention is an electrical test lead for an electrical testing device with the electrical test lead having an inline, replaceable fuse. The electrical test lead is especially, but not necessarily, for use with a digital multi-meter. The present electrical test lead may be embodied as a single electrical test lead or as a pair of electrical test leads.

In one form, the electrical test lead has a fuse assembly comprising a housing adapted to hold and release a fuse in-line of the electrical wire connecting the ends of the electrical test lead. The electrical test lead and/or the fuse assembly may be modular or not. Modular electrical test leads are comprised of separable and inter-connectable test lead portions including various styles of end connectors, fuse assemblies, and wire sections. This allows interchangeability of components, particularly, but not exclusively, the end connectors in order to customize the test lead as desired.

In another form, there is provided an electrical test lead having a fuse assembly holding a replaceable fuse electrically connected to and situated between a first test lead section terminating in a test lead plug that is adapted to be received in a test lead receptacle of a multi-meter and a second test lead section terminating in a test lead probe.

In yet another form, there is provided an electrical test lead having a fuse assembly holding a replaceable fuse electrically connected to and situated between a first test lead section terminating in a test lead plug that is adapted to be received in a test lead receptacle of a multi-meter and a second test lead section terminating in a test lead receptor adapted to receive a test lead tool.

In still another form, there is provided an electrical test lead for a multi-meter, the electrical test lead having a fuse assembly adapted to hold a replaceable fuse and releasably connectable at one end to a first end of a first test lead section that terminates at a second end thereof in a test lead plug that is adapted to be received in a test lead receptacle of the multi-meter, and releasably connectable at a second end to a first end of a second test lead section that terminates at a second end thereof in one of an electrical test probe and a test lead receptor adapted to receive a test lead tool.

In an even further form, there is provided a pair of electrical test leads for a multi-meter each having a fuse assembly holding a replaceable fuse electrically situated between a first test lead section terminating in a test lead plug that is adapted to be received in a test lead receptacle of a multi-meter and a second test lead section terminating in one of an electrical test probe and a test lead receptor adapted to receive a test lead tool.

The fuse holder may be fashioned to replaceably retain any type of fuse and is preferably, but not necessarily, clear in order to see whether the fuse has blown when glass fuses are used. The fuse holder may not be clear when ceramic fuses or the like are used.

The present invention will be more apparent upon reading the following detailed description in conjunction with the accompanying drawings.

BRIEF DESCRIPTION OF THE DRAWINGS

The above mentioned and other features and objects of this invention, and the manner of attaining them, will become more apparent and the invention itself will be better understood by reference to the following description of embodiments of the invention taken in conjunction with the accompanying drawings, wherein.

Like reference numerals indicate the same or similar parts throughout the several figures.

DETAILED DESCRIPTION OF THE PREFERRED EMBODIMENT

Figure 1:
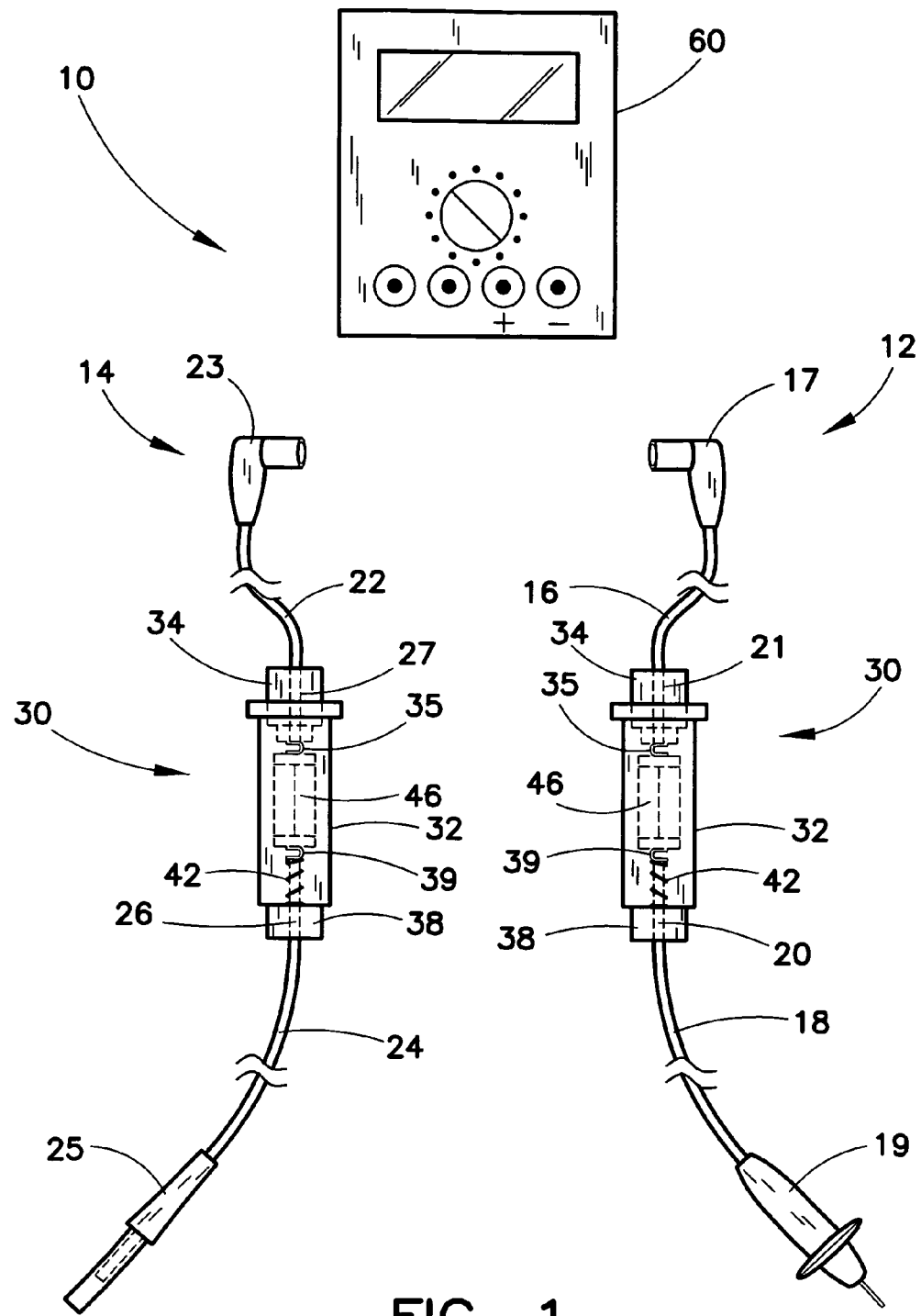
FIG. 1 is an illustrative front view of an exemplary embodiment of a fused electrical test lead fashioned in accordance with the present principles, the fused electrical test lead embodied as a pair of electrical test leads for use with a digital multi-meter, the pair of electrical test leads each having an in-line fuse.

Referring now to FIG. 1, there is shown a pair of electrical test leads, generally designated 10, for use by themselves, each independently, or in conjunction with an electrical test, testing or measurement device, such as digital multi-meter (DMM) 60. It should be appreciated that the principles of the present invention lends itself to various electrical test lead applications. However, the present invention will be discussed predominately with respect to electrical test leads for digital multi-meters. The pair of electrical test leads 10 consists of electrical test lead 12 and electrical test lead 14 which may be arbitrarily labeled first electrical test lead 12 and second electrical test lead 14. Each electrical test lead 12 and 14 is configured to be received by the DMM 60 and used for performing electrical measurements of electrical circuits, control panels, components, elements and/or the like such as current and voltage (among other measurements). In accordance with the principles of the present invention, the electrical test leads 12 and 14 each incorporate a replaceable fuse/fuse assembly that is in electrical communication with the electrical wires of the first and second test leads 12, 14. It should be appreciated that while both electrical test leads 12, 14 of the pair 10 of electrical test leads incorporate a replaceable fuse/fuse assembly, only one electrical test lead of the pair of electrical test leads may have a replaceable fuse/fuse assembly.

The first electrical test lead 12 is characterized by an upper electrical lead section 16 having (and included in the description thereof) an internal electrical wire or wires 21, a lower electrical lead section 18 having (and included in the description thereof) an internal electrical wire or wires 20, and a fuse assembly 30 situated inline of the upper and lower electrical lead sections 16, 18 (connect to and between the wires 21 and 20 thereof). The upper electrical lead section 16 terminates at one end in a plug 17 that is configured or adapted to be releasably received in (connected to) one of the test lead receptacles of the DMM 60 such that the internal wire 21 of the plug 17 provides electrical contact with the meter. The other end of the upper electrical lead section 16 terminates in an upper cap 34 of the fuse assembly 30. The wire 21 of the upper electrical lead section 16 extends through the end cap 34 and is electrically connected to an electrical contact/seat 35.

The lower electrical lead section 18 of the first electrical test lead 12 terminates at one end in a probe 19 (also representing other types of multi-meter tools) that is configured to allow electrical contact with a point on an electrical circuit, control panel, element and/or component or the like. The other end of the lower electrical lead section 18 is attached to the lower cap 38 of the fuse assembly 30 with the wire 20 thereof extending through the lower cap 38 and internally coupled with the probe 19. The wire 20 extends beyond the lower cap 38 and into the fuse holder 32 of the fuse assembly 30 and terminates in electrical contact with a contact/seat 39.

Figures 2, 3:
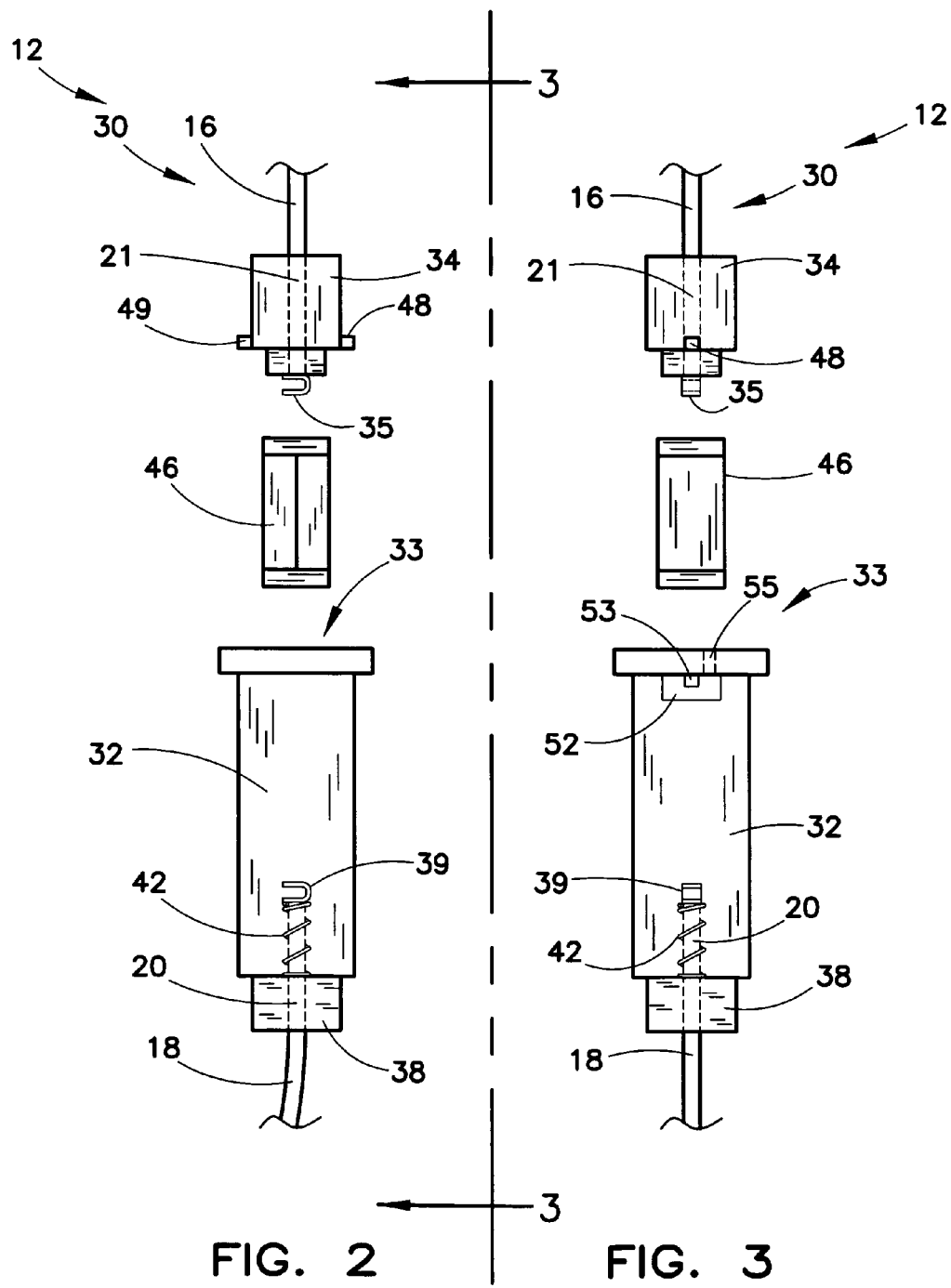
FIG. 2 is an enlarged exploded side view of the fuse assembly of one of the fused electrical test leads of FIG. 1.
FIG. 3 is an enlarged exploded side view of the fuse assembly of FIG. 2 taken along line 3-3 thereof.

Referring additionally to FIGS. 2 and 3, the fuse assembly 30 is configured, adapted and/or operable to removably receive a fuse such as a 5 mm×20 mm type fuse, a ¼"×1¼" type fuse or otherwise, the amperage rating thereof being selected as desired and/or appropriate, but not to exceed the ampere rating of the test lead wire. While only a cylindrical type fuse assembly and thus fuse is shown, it should be appreciated that other types and/or shapes of fuse holders for other types and/or shapes of fuses such as button fuses may be used.

The fuse assembly 30 is characterized by a fuse holder 32 that is preferably, but not necessarily, made from plastic. The fuse holder 32 is also preferably, but not necessarily, clear or translucent so as to allow the user to see or determine whether the fuse 46 therein has blown, if glass or clear type fuses are used, else the fuse holder may be opaque or non-translucent. The fuse holder 32 is generally shaped like the fuse it contains and thus the fuse holder 32 is cylindrical in shape and has a generally cylindrical interior 33. It should be appreciated that if the type of fuse is not cylindrical, the fuse holder may be shaped accordingly.

A spring 42 is provided that extends from the lower cap 38 into the interior 33 of the fuse holder 32. In this embodiment, the lower cap 38 is permanently connected to the fuse holder 32. The spring 42 is sized to be received about the wire 20 of the lower test lead section 18. The electrical contact/seat 39 is situated at the end of the spring 42 when the spring 42 is received onto and over the wire 20 and contact/seat 39. The spring 42 is adapted to bias the fuse 46 toward the end cap 34. This allows the contact/seat 39 to make electrical contact with the fuse 46. The end cap 34 has an electrical contact 35 that is in electrical communication with the wire of the upper test lead section 16. When installed onto the fuse holder 32, the end cap 34 and thus the electrical contact 35 contacts against the end of the fuse 46 and against the bias of the spring 42 to securely hold the fuse 46 in place and provide solid electrical contact between the electrical contacts 35 and 39.

The end cap 34 is removable from the fuse holder 32 in order to place the fuse 46 therein and to remove the fuse 46 therefrom. The end cap 34 includes first and second flanges 48 and 49 that are positioned diametrically opposite one another at the lower end of the end cap 34. The fuse holder 32 includes first and second openings or cutouts of which only one such opening or cutout 53 can be seen, it being understood that the second opening/cutout is positioned diametrically opposite the first opening/cutout 52. A first tab 53 projects into the first opening/cutout 52. A second tab (not seen) likewise projects into the second opening/cutout. A first channel or groove 55 is disposed in an inner side of the fuse holder 32 within the interior 33 thereof and is in communication with the first opening/cutout 52. A second channel or groove (not seen) is likewise disposed in the inner side of the fuse holder 32 within the interior 33 thereof and is in communication with the second opening/cutout. The channels/grooves are configured to receive the flanges 48 and 49 of the cap 34 as the cap 34 is inserted into the top of the fuse holder 32 and into the interior 33 thereof. Pushing the cap 34 downward biases the fuse 46 against the spring 42. A twist of the end cap 34 and a release thereof pushed the end cap 34 upwardly to position the flanges 48, 49 on the other side of the tabs 53 (and not seen). This holds the fuse 46 in place.

The second electrical test lead 14 is characterized by an upper electrical lead section 22 having (and included in the description thereof) an internal electrical wire or wires 27, a lower electrical lead section 24 having (and included in the description thereof) an internal electrical wire or wires 26, and a fuse assembly 30 situated inline of the upper and lower electrical lead sections 22, 24 (connect to and between the wires 27 and 26 thereof). The upper electrical lead section 22 terminates at one end in a plug 23 that is configured or adapted to be releasably received in (connected to) one of the test lead receptacles of the DMM 60 such that the internal wire 27 of the plug 23 provides electrical contact with the meter. The other end of the upper electrical lead section 22 terminates in an upper cap 34 of the fuse assembly 30. The wire 27 of the upper electrical lead section 22 extends through the end cap 34 and is electrically connected to an electrical contact/seat 35.

The lower electrical lead section 24 of the second electrical test lead 14 terminates at one end in a receptacle 25 to which can be releasably connected various types of multi-meter tools for contact/connection with an electrical circuit, control panel, element and/or component or the like. The other end of the lower electrical lead section 22 is attached to the lower cap 38 of the fuse assembly 30 with the wire 26 thereof extending from the receptacle 25, through the lower cap 38 and coupled to the contact/seat 39.

It should be appreciated that the fuse assembly 30 of the second electrical test lead 14 is identical to the fuse assembly 30 of the first electrical test lead 12. Therefore, the description thereof is not repeated.

Figure 4:
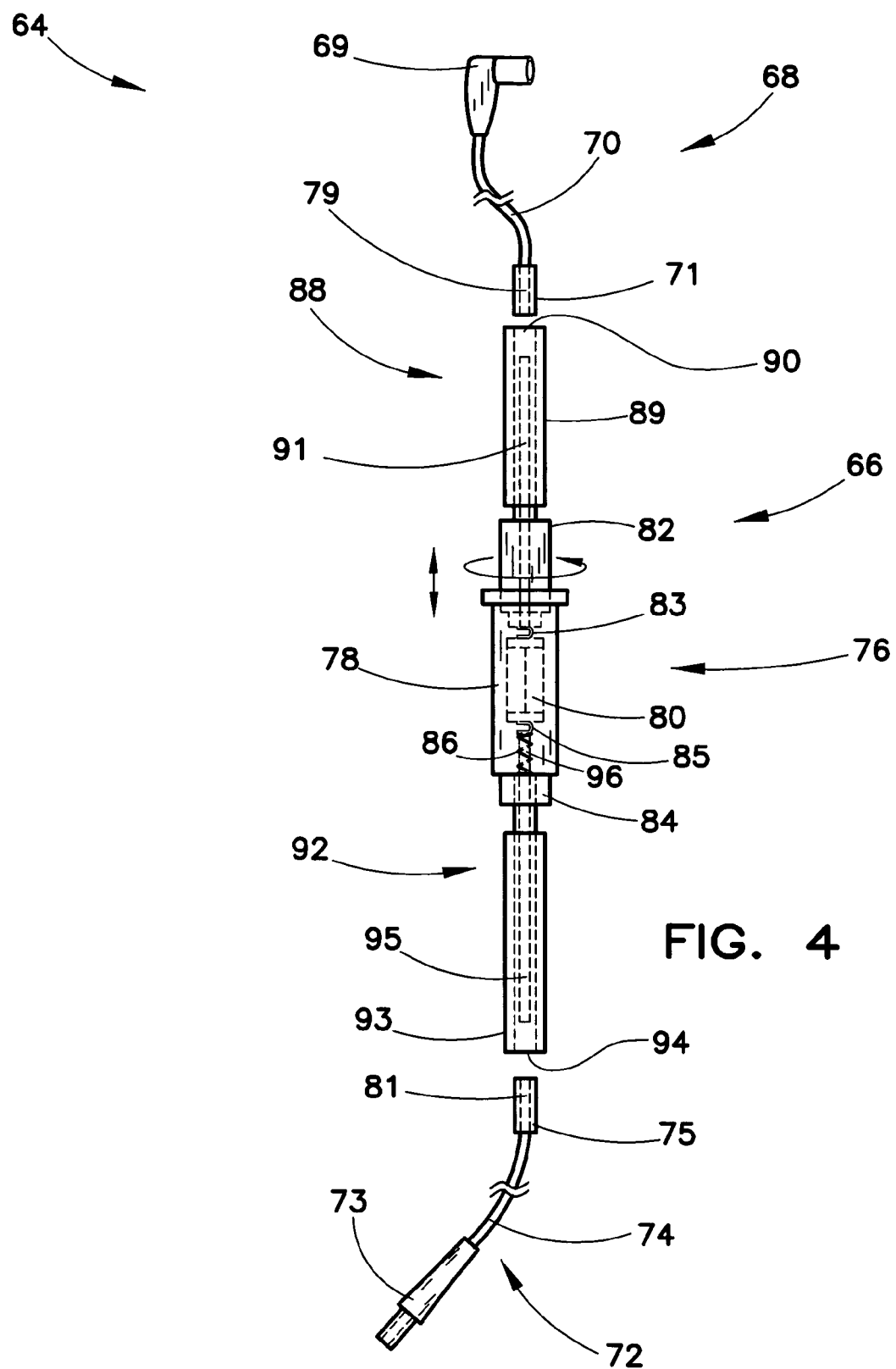
FIG. 4 is a perspective view of another embodiment of a fused electrical test lead fashioned in accordance with the present principles.

Referring to FIG. 4, there is shown an alternative embodiment of an electrical test lead for a multi-meter generally designated 64. The electrical test lead 64 is a modular test lead while the electrical test leads 12 and 14 are not. The electrical test lead 64 includes a fuse assembly 66 that is releasably connectable to an upper test lead section 68 and a lower test lead section 72. The upper test lead section 68 is characterized by a test lead 70 terminating at one end in a multi-meter plug 69 that is configured or adapted to be releasably received in (connected to) one of the test lead receptacles of a multi-meter. The other end of the upper test lead section 68 terminates in a fuse assembly receptor plug 71. The electrical test lead section 68 has an electrical wire or wires 79 internally and electrically connecting the multi-meter plug 69 to the fuse assembly receptor plug 71. The lower test lead section 72 is characterized by a test lead 74 terminating at one end in a fuse assembly receptor plug 75 and at the other end in a receptacle 73 to which can be releasably connected various types of multi-meter tools for contact/connection with an electrical circuit, control panel, element or component. The electrical test lead section 72 has an electrical wire or wires 81 internally and electrically connecting the fuse assembly receptor plug 75 with the receptacle 73.

The fuse assembly 66 is characterized by a fuse holder assembly 76, an upper modular connector 88 and a lower modular connector 92. The fuse holder assembly 76 is similar to the fuse holder assembly 30/fuse holder 32. As such the fuse holder assembly 76 is configured to releasably hold a fuse 80 and includes, among other features as discussed with reference to the fuse holder assembly 30, a fuse holder 78, a lower end cap 84 supporting a spring 86 with an electrical contact/seat 85 connected to conducting post 96 connected to wiring 95, and an upper, removable end cap 82 supporting an electrical contact/seat 83 connected to wiring 91. Since the features, function and manner of use of the fuse holder assembly 76 are the same as the fuse holder 30, they will not be discussed again.

The upper modular connector 88 is characterized by a shaft 89 having an internal cavity 90 that releasably receives the fuse receptor assembly plug 71 of the upper test lead section 68 and provides electrical connection to the electrical contact 83 by the wire/wiring 91 within the shaft 89 and through the upper cap 82 to the contact/seat 83. The lower modular connector 92 is characterized by a shaft 93 having an internal cavity 94 that releasably receives the fuse receptor assembly plug 75 of the lower test lead section 72 and provides electrical connection to the electrical contact 85 by the wire/wiring 95 within the shaft 95 and through the lower cap 84 to the contact/seat 85. In this manner, the modular fuse assembly 66 allows for the interchanging of upper and lower test lead sections as desired.

The modular concept allows re-configuration of an electrical test lead as desired and/or appropriate for a particular job. The 90° test plugs (e.g. plugs 17 and 23) are typical for connection to a multi-meter. Straight connectors (e.g. receptacle 25) are typical for connection to various testing/measurement/multi-meter tools. As such, the test leads 12, 14 and 64 show a typical configuration wherein the test leads have a 90° plug and a straight plug. It should be appreciated that other types and/or configurations of plugs may be used. As well, other test lead configurations may be made utilizing these two types of plugs only. For instance, a test lead may have two (2) 90° plugs or two (2) straight plugs. Other configurations are contemplated.

While the invention has been illustrated and described in detail in the drawings and foregoing description, the same is to be considered as illustrative and not restrictive in character, it being understood that only preferred embodiments have been shown and described and that all changes and modifications that come within the spirit of the invention are desired to be protected.

What is claimed is:

1. An electrical test lead for use with a multi-meter and an electrical measurement instrument, the electrical test lead comprising:

an upper test lead section having a first upper test lead section end and a second upper test lead section end opposite the first upper test lead section end, the first upper test lead section end formed with an integral multi-meter plug that is receivable in a test lead receptacle of said multi-meter;

an upper electrical conductor disposed in the upper test lead section, the upper electrical conductor extending from and in electrical contact with the integral multi-meter plug and the second upper test lead section end;

a lower test lead section having a first lower test lead section end and a second lower test lead section end opposite the first lower test lead section end, the first lower test lead section end formed with an integral electrical measurement instrument plug that is configured to receive an electrical measurement instrument;

a lower electrical conductor disposed in the lower test lead section, the lower electrical conductor extending from and in electrical contact with the integral electrical measurement instrument plug and the second lower test lead section; and a fuse assembly electrically connected at a first fuse assembly end to the upper electrical conductor at the second upper test lead section end and at a second fuse assembly end to the lower electrical conductor at the second lower test lead section end, the fuse assembly holding a replaceable fuse electrically in-line of the upper test lead section and the lower test lead section.

2. The electrical test lead of claim 1, wherein the fuse assembly is releasably electrically coupled to the upper test lead section.

3. The electrical test lead of claim 1, wherein the fuse assembly includes a clear fuse holder configured to releasably hold the replaceable fuse.

4. The electrical test lead of claim 1, wherein the fuse assembly includes a clear cylindrical fuse holder configured to releasably hold a cylindrical replaceable fuse.

5. The electrical test lead of claim 1, wherein the fuse assembly comprises:
   a fuse holder having an internal cavity configured to received the replaceable fuse;
   a lower end cap connected to a lower end of the fuse holder and supporting a lower electrical contact within the internal cavity that is configured to make electrical contact with a lower end of the replaceable fuse, the lower electrical contact in electrical communication with the lower electrical conductor of the lower test lead section; and
   an upper end cap removably connectable to an upper end of the fuse holder and supporting an upper electrical contact that is configured to make electrical contact with an upper end of the replaceable fuse, the upper electrical contact in electrical communication with the upper electrical conductor of the upper test lead section.

6. The electrical test lead of claim 5, wherein the upper end cap downwardly biases the replaceable fuse into the electrically conducting spring.

7. Electrical test leads for use with a multi-meter, the electrical test leads comprising:
   a first test lead having an upper first test lead section with a first multi-meter plug on a first end thereof that is configured for connection to a first multi-meter test lead receptacle of said multi-meter, a lower first test lead section having an end thereof configured for electrical connection with a first electrical instrument, and a first fuse electrically coupled in-line between the upper first test lead section and the lower first test lead section; and
   a second test lead having an upper second test lead section with a second multi-meter plug on a first end thereof that is configured for connection to a second multi-meter test lead receptacle of said multi-meter, a lower second test lead section having an end thereof configured for electrical connection with a second electrical instrument, and a second fuse electrically coupled in-line between the upper second test lead section and the lower second test lead section.

8. The electrical test leads of claim 7, wherein the first fuse is retained in a first fuse holder and the second fuse is retained in a second fuse holder.

9. The electrical test leads of claim 8, wherein the first and second fuse holders are configured to releasably retain the first and second fuses respectively so as to allow replacement of a blown fuse with a new fuse.

10. The electrical test leads of claim 9, wherein the first and second fuse holders are clear to allow external viewing of the first and second fuses respectively therein.

11. The electrical test leads of claim 8, wherein:
   the first fuse holder is releasably connected between the upper first test lead section and the lower first test lead section; and
   the second fuse holder is releasably connected between the upper second test lead section and the lower second test lead section.

12. The electrical test leads of claim 8, wherein:
   the upper first test lead section is releasably connected to the first fuse holder to allow replacement of a blown first fuse with a new fuse; and
   the upper second test lead section is releasably connected to the second fuse holder to allow replacement of a blown second fuse with a new fuse.

* * * * *